US009383657B2

(12) United States Patent
Wang et al.

(10) Patent No.: US 9,383,657 B2
(45) Date of Patent: Jul. 5, 2016

(54) METHOD AND STRUCTURE FOR LITHOGRAPHY PROCESSES WITH FOCUS MONITORING AND CONTROL

(71) Applicant: Taiwan Semiconductor Manufacturing Company, Ltd., Hsin-Chu (TW)

(72) Inventors: Jhih-Yu Wang, New Taipei (TW); Chien-Yu Li, Hsinchu (TW); Iu-Ren Chen, Taipei (TW); Chi-Cheng Hung, Miaoli County (TW); Wei-Liang Lin, Hsin-Chu (TW); Chun-Kuang Chen, Hsin-Chu Hsien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 204 days.

(21) Appl. No.: 14/194,960

(22) Filed: Mar. 3, 2014

(65) Prior Publication Data

US 2015/0248068 A1 Sep. 3, 2015

(51) Int. Cl.
*G03F 7/20* (2006.01)

(52) U.S. Cl.
CPC ........ *G03F 7/70641* (2013.01); *G03F 7/70625* (2013.01)

(58) Field of Classification Search
CPC . G03F 7/70641; G03F 7/70625; G03F 7/705; G03F 1/144; G03F 7/70558; G03F 7/70616; G03F 1/44
See application file for complete search history.

(56) References Cited

U.S. PATENT DOCUMENTS 6,066,419 A * 5/2000 Wu ..................... G03F 7/70558 430/30
6,376,139 B1 * 4/2002 Fujisawa ............ G03F 7/70625 430/30
6,414,326 B1 * 7/2002 Nguyen ............. G03F 7/70558 250/492.2
2002/0097399 A1 * 7/2002 Ausschnitt .......... G03F 7/70641 356/401
2004/0224242 A1 * 11/2004 Izuha ................. G03F 7/70641 430/5
2005/0168716 A1 * 8/2005 Ausschnitt .......... G03F 7/70516 355/55
2011/0249244 A1 * 10/2011 Leewis .................... G03F 7/706 355/27

OTHER PUBLICATIONS

Mack, Chris, Lithographic Control in Semiconductor Manufacturing, 2007, John Wiley & Sons, Ltd, Chapter 8, pp. 297-386.*

* cited by examiner

*Primary Examiner* — Steven H Whitesell Gordon
(74) *Attorney, Agent, or Firm* — Haynes and Boone, LLP

(57) ABSTRACT

A method for lithography exposing process is provided. The method includes performing a first lithography exposing process to a resist layer using a mask having a focus-sensitive pattern and an energy-sensitive pattern; measuring critical dimensions (CDs) of transferred focus-sensitive pattern and transferred energy-sensitive pattern on the resist layer; extracting Bossung curves from the CDs; and determining slopes of the Bossung curves.

20 Claims, 11 Drawing Sheets

100

102 Perform a lithography exposing process to a resist layer using focus-sensitive pattern and energy-sensitive pattern 104 Develop the resist layer 106 Measure critical dimensions (CDs) of the focus-sensitive pattern and energy-sensitive pattern 108 Extract Bossung curves from the CD measurement 110 Normalize the Bossung curves 112 Determine the slopes of the normalized Bossung curves

METHOD AND STRUCTURE FOR LITHOGRAPHY PROCESSES WITH FOCUS MONITORING AND CONTROL

BACKGROUND

Semiconductor integrated circuit (IC) technology has experienced rapid progress including the continued minimization of feature sizes and the maximization of packing density. The minimization of feature size relies on improvement in photolithography and its ability to print smaller features or critical dimensions (CD), and further relies on the tuning of the lithography exposing process. However, in the advanced technology nodes, the processing window is getting smaller and the CD control has a limited margin. The existing method is not effective and may cause various issues, such as bridge or scum defects.

Therefore, a method and structures used the method are needed to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
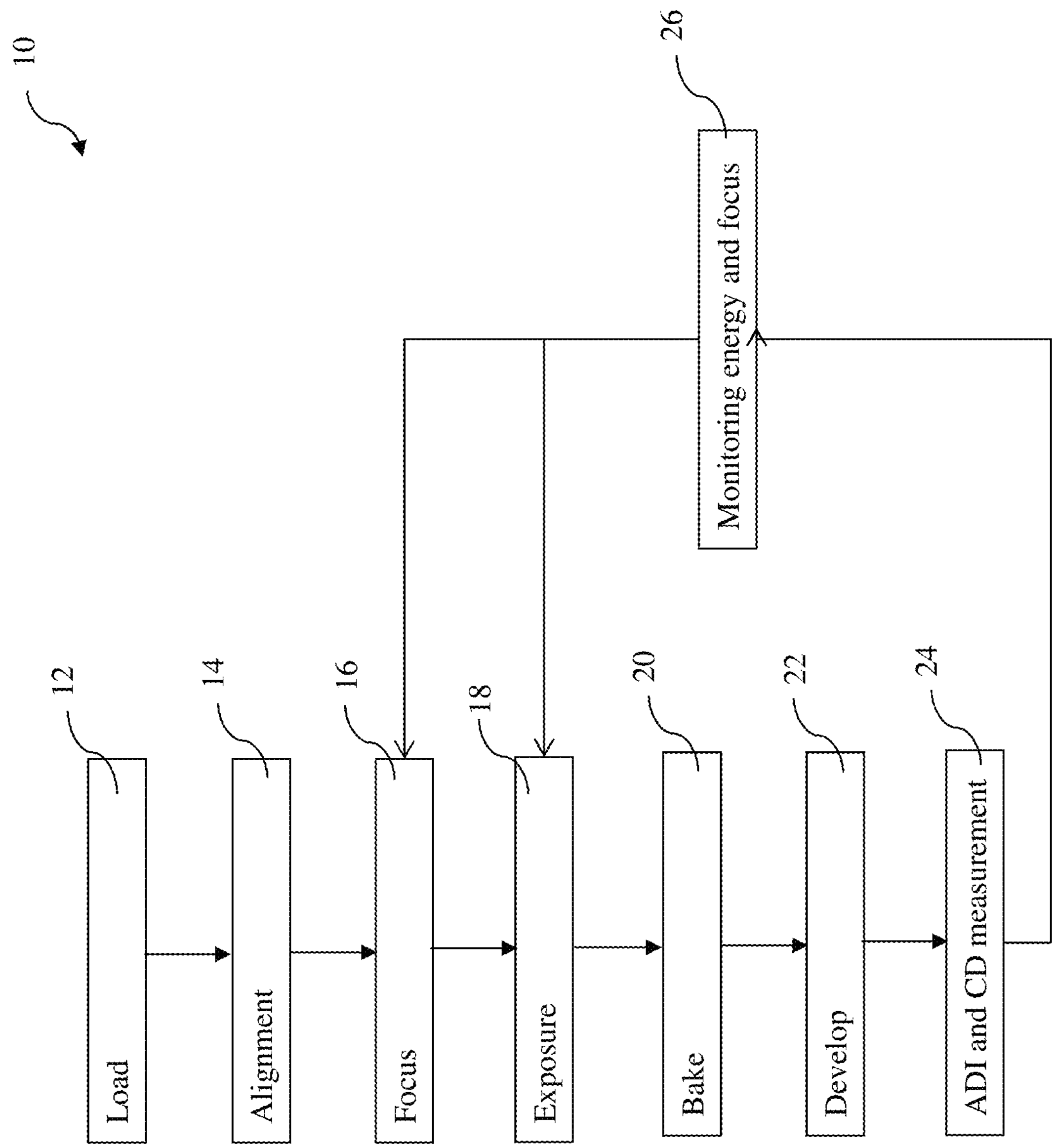
FIG. 1 is a flowchart of a method for a lithography process with automatic process control constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 10 of performing a lithography process in accordance with some embodiments. The method 10 is described with reference to FIG. 1 and other figures. The method 10 includes an operation 12 by loading to a photomask (also referred to as mask) to a lithography system. The mask is patterned according to an integrated circuit design layout. In various embodiments, the mask further includes various test patterns including energy-sensitive pattern and focus-sensitive pattern. The energy-sensitive pattern is a patterned designed to be relatively sensitive to the exposing energy (exposing dose) relative to the focus distance during a lithography exposing process. Similarly, the focus-sensitive pattern is another patterned designed to be relatively sensitive to the exposing focus distance relative to the exposing energy of the lithography exposing process. By incorporating both energy-sensitive pattern and focus-sensitive pattern on the mask, the two processing parameters energy and focus are decoupled.

Figure 2:
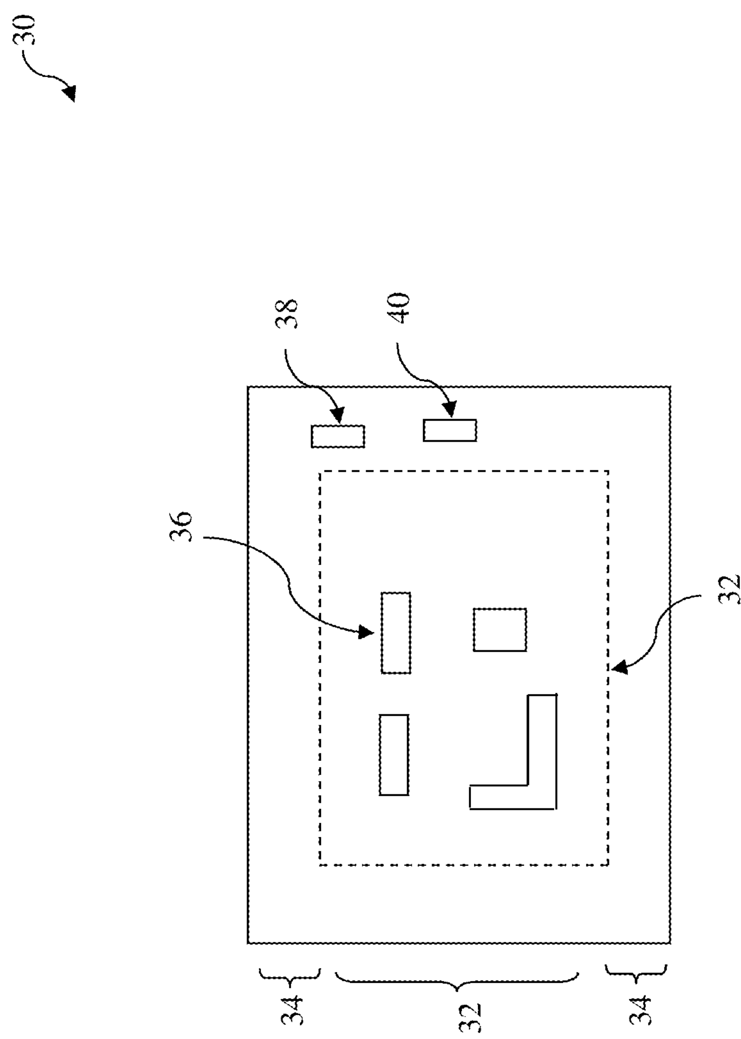
FIG. 2 is a top view of a photomask used in the method of FIG. 1 constructed in accordance with some embodiments.

FIG. 2 is a top view of a mask 30 in accordance with some embodiments. The mask 30 includes a circuit region 32 and a frame region 34, which is on the edges of the mask and surrounds the circuit region 32. A circuit pattern is defined in the circuit region 32 and includes various features 36 that are designed and configured according to the integrated circuit (IC) design layout. The frame region 34 may include some test patterns and some non-circuit patterns, such as marks, mask identification number, barcode, and/or other non-circuit features. In some embodiments, the test patterns are disposed in the frame region 34. Particularly, the mask 30 includes two types of test patterns designed to monitor respective parameters of the lithography exposing processes. Furthermore, the mask 30 includes one or more energy-sensitive pattern 38 designed to have a higher sensitivity to the exposing dose (or exposing energy or energy) and a lower sensitivity to the focus of the lithography exposing processes. The mask 30 includes one or more focus-sensitive pattern 40 designed to have a higher sensitivity to the focus and a lower sensitivity to the energy of the lithography exposing processes. Thereby, the impacts of energy and focus to critical dimension (CD) variations are decoupled and are able to be respectively analyzed. In some embodiments, the energy-sensitive pattern 38 and the focus-sensitive pattern 40 are disposed on the frame region 34. Alternatively, the energy-sensitive pattern 38 and the focus-sensitive pattern 40 are disposed in the circuit region 32 or distributed in both the circuit region 32 and the frame region 34.

Figure 3:
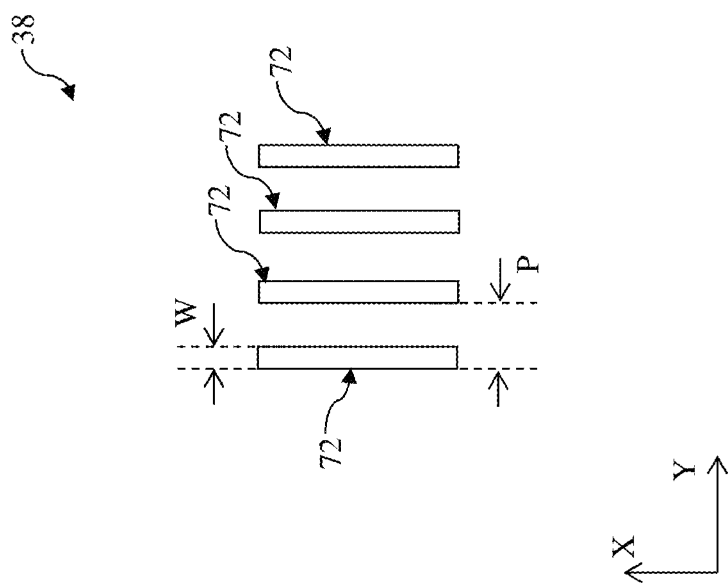
FIG. 3 is a schematic view of an energy-sensitive pattern formed on photomask of FIG. 2 and used in the method of FIG. 1, constructed in accordance with some embodiments.

In some embodiments, the energy-sensitive pattern 38 has a set of features with high pattern density. FIG. 3 illustrates a top view of an energy-sensitive pattern 38 constructed in accordance with some examples. The energy-sensitive pattern 38 includes a plurality of line features 72 oriented in a first direction (such as X direction). The line features 72 are parallel configured along a second direction (such as Y direction) perpendicular to the first direction. The line features 72 each have a width "W" spanning along the second direction. The line features 72 have a pitch "P" defined in the second direction. The pitch is measured from an edge of one line feature to the corresponding edge of an adjacent line feature. In one embodiment, a pitch to width ratio, defined as P/W, is equal to or less than 4 for proper pattern density to be sensitive to exposing energy of the lithography exposing process.

Figure 4:
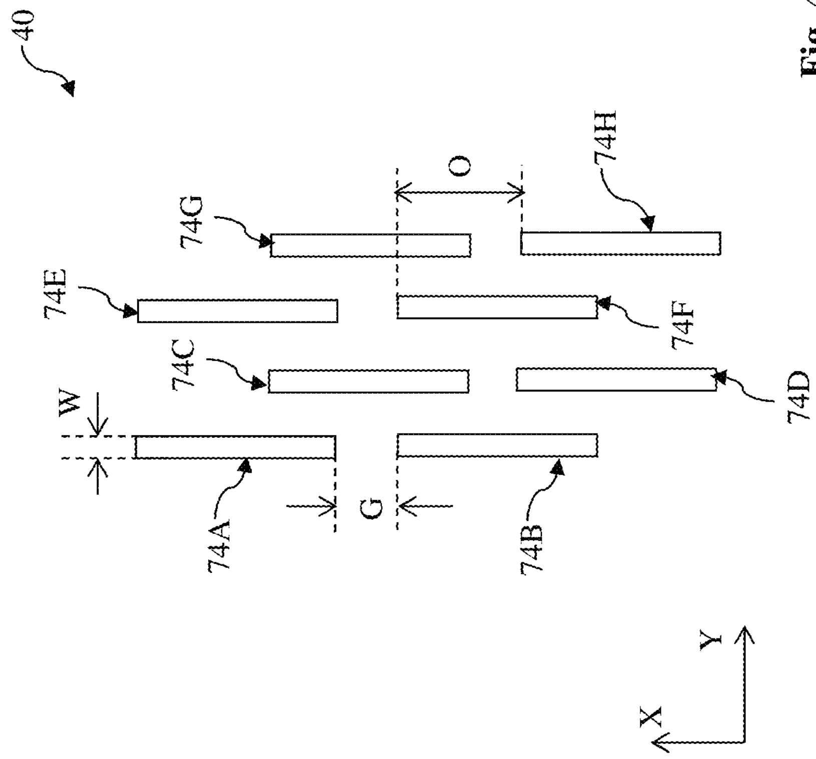
FIG. 4 is a schematic view of a focus-sensitive pattern formed on photomask of FIG. 2 and used in the method of FIG. 1, constructed in accordance with some embodiments.

In some embodiments, the focus -sensitive pattern 40 has a group of features designed and configured in consideration of various focus-sensitive factors, such as line end gap "G", line offset "O" and/or pattern density. Particularly, the focus-sensitive pattern is designed with consideration of mask three-dimensional (M3D) effect. The mask 3D profile may block light and degrade the image effect. The focus-sensitive pattern is also sensitive the M3D effect. FIG. 4 illustrates a top view of a focus-sensitive pattern 40 constructed in accordance with some examples. The focus-sensitive pattern 40 includes a plurality of line features 74 (such as line features 74A through 74H) configured with a high pattern density. In some embodiments, the line features are oriented in a first direction (such as X direction) and are configured in parallel. The line features 74 have a width "W" spanning along the second direction (Y direction). Furthermore, the line features 74 are configured with offset and restriction of the line end gap (or gap). Particularly, the gap between the line ends is less than a certain limit. In one example as illustrated in FIG. 4, the line feature 74A and 74B have a line width "W" and are disposed on a same line with a gap "G" between the adjacent ends of the corresponding line features. A ratio of G/W is less than 1.2 in the present example. In another example where line features are configured with certain offset. As illustrated FIG. 4, various feature lines are configured to have offset to other feature lines. Particularly, the line features 74C and 74D are configured to have offset with adjacent line features, such as line features 74A and 74B on left side and line features 74E and 74F on right side, where the gap between line features 74C and 74D is not aligned with the gap of the line features 74A and 74B (and 74E and 74F as well), instead the gaps are offset from each other along the first direction (or X direction). State differently, the line ends are not aligned, such as one example illustrated in FIG. 4. The line features 74F and 74H have respective line ends on same end. Those line ends are not aligned with each but are offset from each other in the first direction (X direction) by a distance "O". In another example, the focus-sensitive pattern 40 includes all limitations described above: restriction to the line end gap and the offset from line features.

When those test patterns (energy-sensitive pattern and focus-sensitive pattern) being transferred to the corresponding resist layer by a lithography exposing process, the line features 72 are islands or alternatively trenches (which are openings defined in the patterned resist layer).

The mask 30 may be any suitable type of mask, such as binary intensity mask (BIM). In one embodiment, the mask is a transmissive type and is used in ultraviolet lithography. The mask includes a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. A light beam may be partially or completely blocked when directed on an absorption region. The absorption layer is patterned to have one or more openings through which a light beam may travel without being absorbed by the absorption layer. The mask may incorporate other resolution enhancement techniques such as phase shift mask (PSM) and/or optical proximity correction (OPC).

In another embodiment, the mask is a reflective type and is used in extreme ultraviolet (EUV) lithography. The mask includes a substrate with a suitable material, such as a low thermal expansion material (LTEM). In various examples, the LTEM includes $TiO_2$ doped $SiO_2$, or other suitable materials with low thermal expansion. The mask includes a multiple reflective layers (ML) deposited on the substrate. The ML includes a plurality of film pairs, such as molybdenum-silicon (Mo/Si) film pairs. The mask further includes an absorption layer, such as a tantalum boron nitride (TaBN) layer, deposited over the ML. The absorption layer is patterned to define a layer of an integrated circuit.

Figure 5:
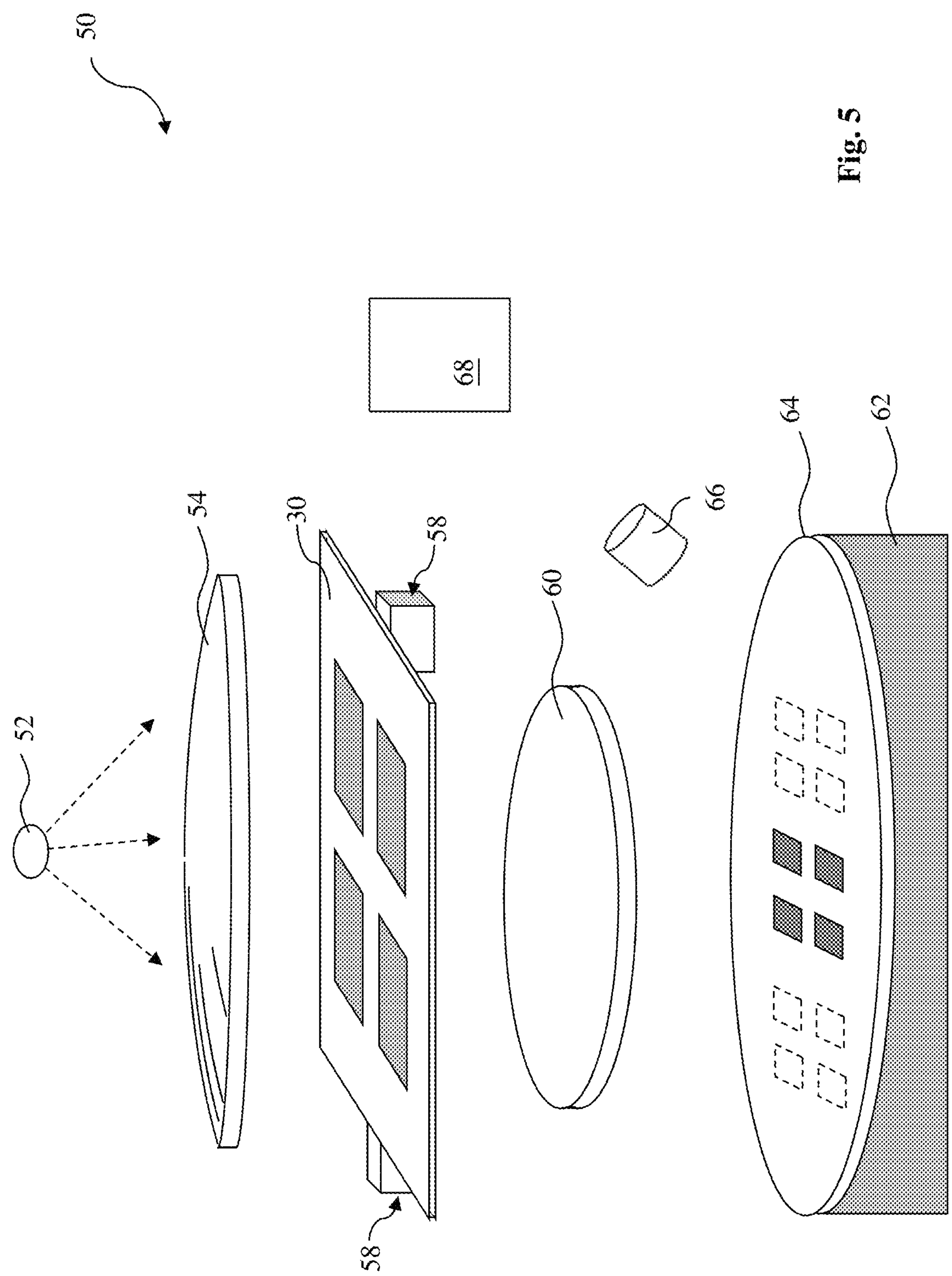
FIG. 5 is a schematic view of a lithography system employed in the method of FIG. 1 constructed in accordance with some embodiments.

Back to the operation 12 in FIG. 1, the lithography system is designed to perform a lithography exposing process to photosensitive layer (also referred to as photoresist or resist layer) coated on a substrate (such as a semiconductor wafer) such that the pattern defined in the mask is transferred to the photoresist layer as a latent pattern thereby. FIG. 5 is a schematic view of a lithography system 50 constructed in accordance with some embodiments. The lithography system 50 includes a radiation source (or source) 52 to provide radiation energy. The radiation source 52 may be any suitable light source. In various embodiments, the radiation source may include an optical source selected from the group consisting of ultraviolet (UV) source, deep UV (DUV) source, EUV source, and X-ray source. For example, the source 52 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source has a wavelength of about 13.5 nm or less.

The lithography system 50 also includes an optical subsystem that receives the radiation energy from the radiation source 52, modulates the radiation energy by the image of a mask and directs the radiation energy to a photoresist layer coated on a substrate. In some embodiments, the optical subsystem is designed to have a refractive mechanism. In this situation, the optical subsystem includes various refractive components, such as lenses. In other embodiments where the radiation energy is EUV energy, the optical subsystem is designed to have a reflective mechanism. In this situation, the optical subsystem includes various reflective components, such as mirrors.

In some particular embodiments, the lithography system 50 includes an illumination module (e.g., a condenser) 54. The illumination module 54 may include a single lens or a lens module having multiple lenses and/or other lens components. For example, the illumination module 54 may include microlens arrays, shadow masks, and/or other structures designed to aid in directing radiation energy from the radiation source 52 onto the mask 30.

The mask 30 is loaded in the lithography system 50 and secured on a mask stage 58 of the lithography system 50. The mask stage 58 is designed and configured to be operable for translational and rotational motions.

The lithography system 50 includes a projection module 60. The projection module 60 may have a single lens element or a plurality of lens elements configured to provide proper illumination to the resist layer on a wafer. Each lens element may include a transparent substrate and may further include a plurality of coating layers. The illumination module 54 and the projection module 60 are collectively referred to as an imaging module (or imaging optics). The imaging lens may further include additional components such as an entrance pupil and an exit pupil to form an image of the mask 56 on a substrate to be patterned. In another embodiment, the projection module 60 may include various minor components to provide a reflective mechanism.

The lithography system 50 may further include a substrate stage 62 that is capable of securing and moving a substrate 64 in translational and rotational modes such that the substrate 64 may be aligned with the mask 56.

In the present example, the substrate 64 is coated with a photoresist layer and is provided in the lithography system 50 for receiving a lithography exposing process. In one embodiment, the substrate 64 includes a semiconductor wafer having an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or a combination thereof. In furtherance of the present embodiment, a radiation-sensitive layer, such as a photoresist (or resist) layer, is coated on the substrate 64 and receives the radiation energy from the radiation source 52 during the lithography exposing process.

The lithography system 50 may be designed differently according to different characteristics of the radiation source and other factors. In one example, the radiation source 110 includes a EUV source having a wavelength around 13.5 nm. In this case, the imaging module is different due to the characteristics of the EUV, such as absorption. For example, the imaging module associated with the EUV source includes reflective optical components and reflective mask, as noted above.

In some embodiments, the lithography system 50 may include a measurement module 66 designed and configured to extract the dimensional data from the exposed resist layer coated on the substrate 64. The measurement module 66 includes a suitable mechanism, such as microscope, to extract dimensional data from the latent pattern of the exposed resist layer. The measurement module 66 is embedded in the lithography system 50 and is integrated with other modules and components of the lithography system 50. Thus, in-line data may be directly extracted from the substrates during the corresponding lithography exposing processes. In alternative embodiments, the measurement module 66 is a standalone metrology tool for CD measurement and is coupled with the lithography system 50 for data communication. In this case, CD data may be collected form developed resist layer of the substrates during an after-developing inspection (ADI).

In furtherance of some embodiments, the lithography system 50 includes an exposure analysis and tuning module 68 coupled with the measurement module 66 to analyze the CD data from the measurement module 66 and analyze the CD data to determine focus corrections and energy corrections. The exposure analysis and tuning module 68 is further coupled with other modules of the lithography system 50 for focus correction and energy correction. The exposure analysis and tuning module 68 may include a data processing unit, such as central processing unit (CPU) for data processing. In some embodiments, the module 68 is distributed in an intranet or a portion of the Internet coupled with the lithography system 50. The module 68 is capable of collecting the CD data, processing the CD data, and generating one or more control parameters to control focus and/or energy of the lithography exposing process in order to compensate the CD variations.

Back to FIG. 1, the operation 12 may further include load the substrate 64 to the substrate stage 62 of the lithography system 50. Prior to the loading, the substrate 64 is coated with the resist layer by a suitable technique (such as spin-on coating) and may be further baked to reduce the solvent.

The method 10 may include an operation 14 of alignment, which aligns the substrate 64 and the mask 56 so that the pattern defined on the mask 56 is properly transferred to the substrate 64.

The method 10 proceeds to an operation 16 by tuning focus of the imaging optics. For example, the distance along the optical axis between the mask 56 and the substrate 64 is adjusted accordingly. In some embodiments, the operation 16 of focus tuning is implemented additionally based on the focus correction (from a procedure 26). The focus correction enhances the imaging resolution and further compensates CD variation. The focus correction is determined according to the focus Bossung curve (or focus slope, which will be described later) and the CD variation feedback from the procedure 26.

The method 10 proceeds to an operation 18 by performing a lithography exposing process to the resist layer coated on the substrate 64. During the lithography exposing process, the radiation energy (such as UV beam) is directed on the resist layer and carries an image of the IC pattern defined on the mask 56, thereby forming a latent pattern on the resist layer. The resist layer is sensitive to the radiation energy and is chemically changed by the radiation energy. For example where the resist layer is positive tone resist, the exposed portion of the resist layer will be removed by the developing process. In another example where the resist layer is negative tone resist, the unexposed portion of the resist layer will be removed by the developing process but the exposed portion remains. Therefore, by the corresponding developing process at operation 22, the latent pattern of the exposed resist layer is transferred to a physical pattern of the resist layer with various openings. During the lithography exposing process, the exposing dose (also referred to as exposing energy) is adjusted according to the energy correction $\Delta E$ (from the procedure 26) to reduce CD variations according to some embodiments. The focus correction is determined according to the energy Bossung curve (or energy slope, which will be described later) and the CD variation feedback from the procedure 26. In some embodiments, the focus correction $\Delta f$ and the energy correction are collectively considered and tuned to effectively compensate CD variation.

The method 10 may further include an operation 20 for baking, such as post-exposure baking (PEB), to the resist layer with a suitable baking temperature. At the operation 22 of developing, the patterned resist layer having various openings is formed. The patterned resist layer defines various circuit features that will be further transferred to an underlying material layer on the substrate, such as by etching.

The method 10 may further include an operation 24 for after-developing inspection (ADI). During the ADI, various critical dimensions (CDs) of the patterned resist layer are measured by a suitable metrology tool, such as a microscope designed for the CD measurement. Particularly, the CD measurements are implemented to the focus-sensitive pattern and the energy-sensitive pattern. The operation 24 may include other actions, such as the monitoring and measurement of overlay errors at the ADI.

The method 10 may further include other operations. In some embodiments for illustration, the method 10 includes an etching process applied to the substrate 64 using the patterned resist layer as an etching mask. In other embodiments, the method 10 includes an ion implantation process applied to the substrate 64 using the patterned resist layer as an implantation mask. In the present embodiment, the method 10 has a feedback loop for automatic process control (APC) such that various parameters (such as focus and energy) of the lithography exposing process can be tuned for better CD control and CD compensation.

Especially, the method 10 includes a procedure 26 that extracts focus and energy parameters according to the ADI measurement and feedback those parameters to the lithography exposing processes for dynamically tuning and controlling of the lithography exposing process. The procedure 26 may include a plurality of operations and is further described in FIG. 6 in accordance with some embodiments.

Figure 6:
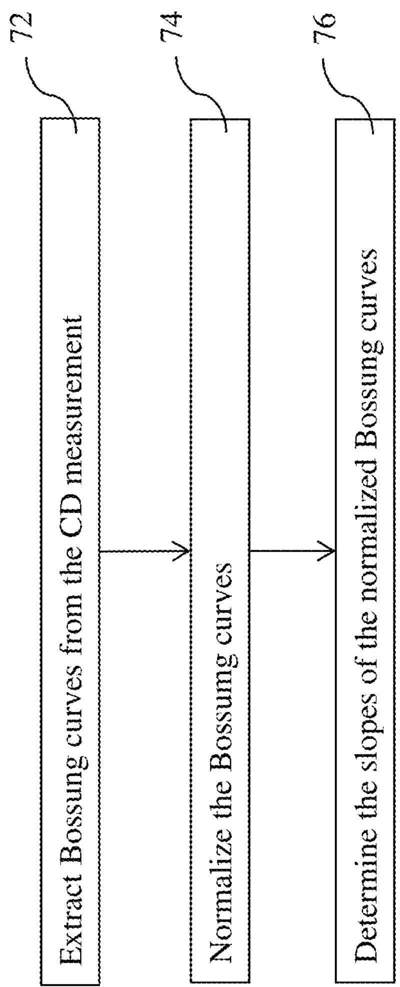
FIG. 6 is a flowchart of a method for focus and energy monitoring and controlling in accordance with some embodiments.

FIG. 6 is a flowchart of the procedure 26 associated with focus and energy parameters in accordance with some embodiments. The procedure 26 begins with CD data collected at the operation 24, such as from the after-developing inspection. The CD data are collected from a plurality of substrates through the lithography exposing processes under various conditions (exposing focus and energy). For example, a group of substrates are exposed with various combinations of focus and energy. In some embodiment, those substrates are production wafers. In some other embodiments, those substrates are test wafers processed with the lithography exposing process of various conditions (focus and energy) designed for the CD collection. In yet some embodiments, the CD data are collected from a combination of both production wafers and test wafers. In some particular embodiments, the CD data are initially collected from test wafers. After the model is built up and the CD data are collected from production wafers for process tuning through the feedback by the procedure 26.

Figure 8:
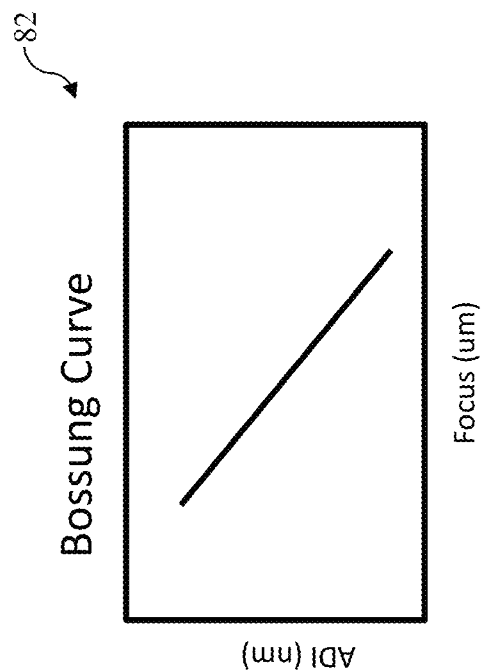
FIGS. 7 through 13 are diagrammatic view of various Bossung curves constructed in accordance with some embodiments.
Figure 7:
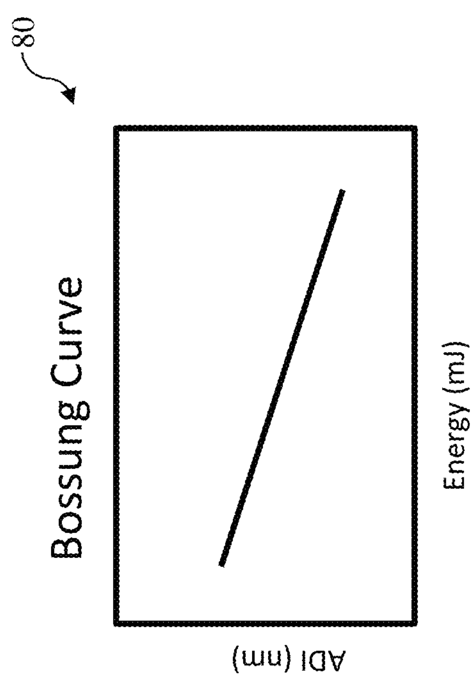

The procedure 26 includes an operation 72 by extracting Bossung curves from the CD data. As described above, the CD data are collected from the energy-sensitive pattern 38 and the focus-sensitive pattern 40, respectively. Those data are used to construct CD over energy and CD over focus curves, respectively, which are referred to as Bossung curves. In this case, the CD data from the energy-sensitive pattern are collected from the lithography exposing processes that have a same focus set but respective energy. Similarly, the CD data from the focus-sensitive pattern are collected from the lithography exposing processes that have a same energy set but respective focus. Particularly, the CD data collected from the energy-sensitive pattern 38 are used to construct energy Bossung curve. The CD data collected from the focus-sensitive pattern 40 are used to construct focus Bossung curve. Due to carefully designed test patterns (such as 38 and 40), the corresponding Bossung curves are substantially linear, such as energy Bossung curve 80 illustrated in FIG. 7 and focus Bossung curve 82 illustrated in FIG. 8. In FIG. 7 for the Bossung curve 80, the vertical axis represents CD in nanometer (labeled as ADI as the CD data collected at ADI) of various features from the energy-sensitive pattern 38 and the horizontal axis represents for energy (exposing dose) in suitable unit (such as mJ) of the corresponding lithography exposing process. In FIG. 8 for the Bossung curve 82, the vertical axis represents CD (in nm) of various features from the focus-sensitive pattern 38 and the horizontal axis represents for focus (exposing dose) in suitable unit (such as micron) of the corresponding lithography exposing process.

In the following description of various operations, the focus-sensitive pattern and focus Bossung curves are used as example for most explanation and illustration, even similar operations may be applied to the energy-sensitive pattern and energy Bossung curves as well.

Figure 10:
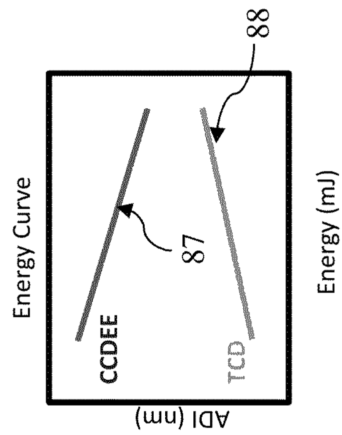
Figure 9:
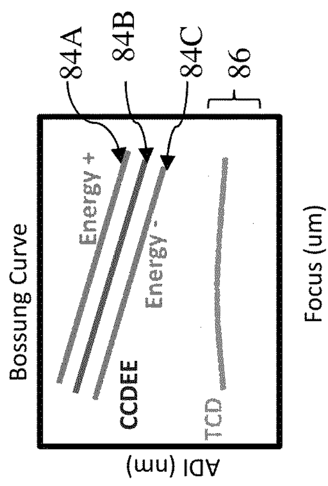

In some embodiments, the CD data from the focus-sensitive pattern are constructed to form more than one focus Bossung curve. In furtherance of the embodiments, the CD data from both the focus-sensitive pattern and the energy-sensitive pattern are collected over the lithography exposing processes with various combinations of focus and energy. CD data from the focus-sensitive pattern are grouped to according to the parameter energy. Each group of the CD data has a same energy but different focus. Thus, each group of the CD data from the focus-sensitive pattern are constructed to form one focus Bossung curve corresponding to that energy. As illustrated in FIG. 9 as one example, three focus Bossung curves 84 (labeled as CCDEE, standing for critical CD end-to-end) are formed based on the CD data from the focus-sensitive pattern 40 and are substantially linear. In this example, the focus Bossung curve 84A corresponds to an exposing energy greater than that of the focus Bossung curve 84B. The focus Bossung curve 84C corresponds to an exposing energy less than that of the focus Bossung curve 84B. Other three focus Bossung curves (labeled as TCD, standing for target CD) 86 are formed based on the CD data from the energy-sensitive pattern 38 and are not substantially linear (each has a maximum). FIG. 10 illustrates an energy Bossung curve 87 from the focus-sensitive pattern 40 and another energy Bossung curve 88 from the energy-sensitive pattern 38.

Figure 12:
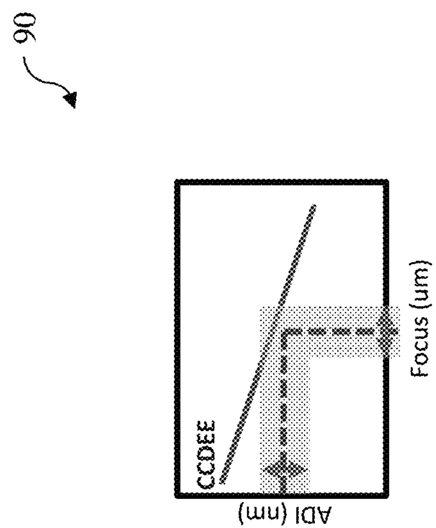
Figure 11:
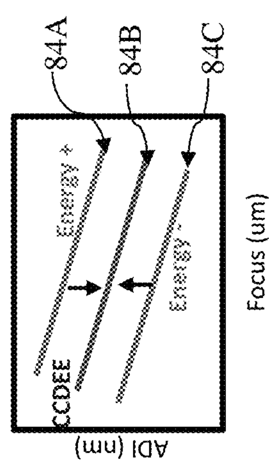

In some embodiment, the procedure 26 may further include an operation 74 by normalize the Bossung curves, such as normalizing a plurality of focus Bossung curves to a single focus Bossung curve, and/or normalizing a plurality of energy Bossung curves to a single energy Bossung curve. During the normalization at the operation 74, the CD bias of the focus Bossung curves due to energy effect are removed. This is further explained with reference to FIGS. 11 and 12. Three focus Bossung curves 84A, 84B and 84C are shown in FIG. 11. In each curve, the CD data are associated with a same exposing energy but respective focus. By removing the CD bias among different focus Bossung curves, the CD data are normalized to the CDs associated with a same energy. Accordingly, the various focus Bossung curves are simplified to one focus Bossung curve 90 (also referred to as normalized focus Bossung curve), as illustrated in FIG. 12. For more detailed operation in one example, the normalization of the CD data of the focus-sensitive pattern (the focus Bossung curves as well) is based on an energy Bossung curve. One energy is chosen, the CD data (of the focus-sensitive pattern) associated with a second energy different from the choosing energy will be abstracted by a CD bias ΔCD found from the energy Bossung curve according to the energy difference ΔE between the choosing energy and the second energy. By the normalization, the CD data are consolidated to one focus Bossung curve, such as the normalized focus Bossung curve 90.

The procedure 26 further includes an operation 76 by determining the slope of a normalized Bossung curve, such as the first slope (or focus slope) of a normalized focus Bossung curve, and/or the second slope (or second slope) of a normalized energy Bossung curve. Since the Bossung curves from the focus-sensitive pattern and the energy-sensitive pattern, respectively, are substantially linear, the corresponding slopes are constants. The first and second slope are feedback to the lithography system 50 for tuning the focus and energy of the lithography exposing process in the automatic process control as illustrated in the method 10 of FIG. 1. The first slope (focus slope) $S_f$ is defined as the relative change of CD over the relative change of focus in the focus Bossung curve, and the second slope (energy slope) $S_e$ is defined as the relative change of CD over the relative change of energy in the energy Bossung curve.

The tuning of the focus (and energy) of the lithography exposing process (such as the operation 16 and 18 in the method 10) according to the feedback from the procedure 26 includes finding respective focus correction Δf (and energy correction ΔE). In some embodiments where only the focus is tuned to compensate the CD variation (ΔCD), then the focus bias Δf is determined as $$\Delta CD = S_f * \Delta f \quad \text{(eq. 1)}$$

Figure 13:
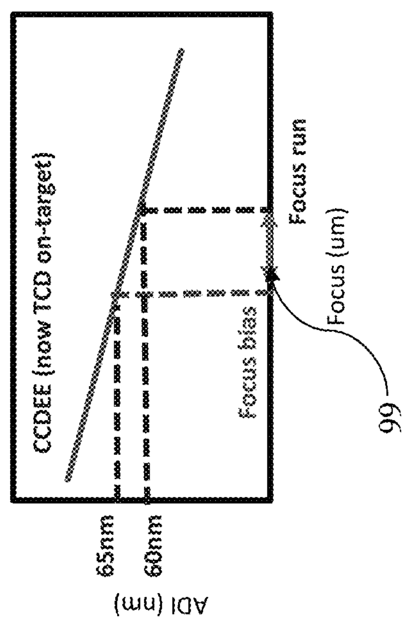

Take one example illustrated in FIG. 13, the targeted CD is 60 nm. When the measured the CD from the focus-sensitive pattern in the last product lot is 65 nm, the CD bias ΔCD is 5 nm, then the corresponding focus bias is $\Delta CD/S_f$. The focus correction 99 represents the change to be changed to the lithography exposing process, therefore is opposite to the focus bias. For example, if the focus bias is Δf and the focus correction is −Δf. In this example illustrated in FIG. 13, the focus needs to be increased to tune the CD back on target.

In some embodiments where only the energy is tuned to compensate the CD variation (ΔCD), then the energy bias ΔE is determined as $$\Delta CD = S_e * \Delta E \quad \text{(eq. 2)}$$

The energy correction is opposite to the energy bias.

In some embodiments where the CD variation (ΔCD) is compensated by collectively tuning both focus and energy, then the focus bias Δf and energy bias ΔE are determined as $$\Delta CD = S_f * \Delta f + S_e * \Delta E \quad \text{(eq. 3)}$$

Figure 14:
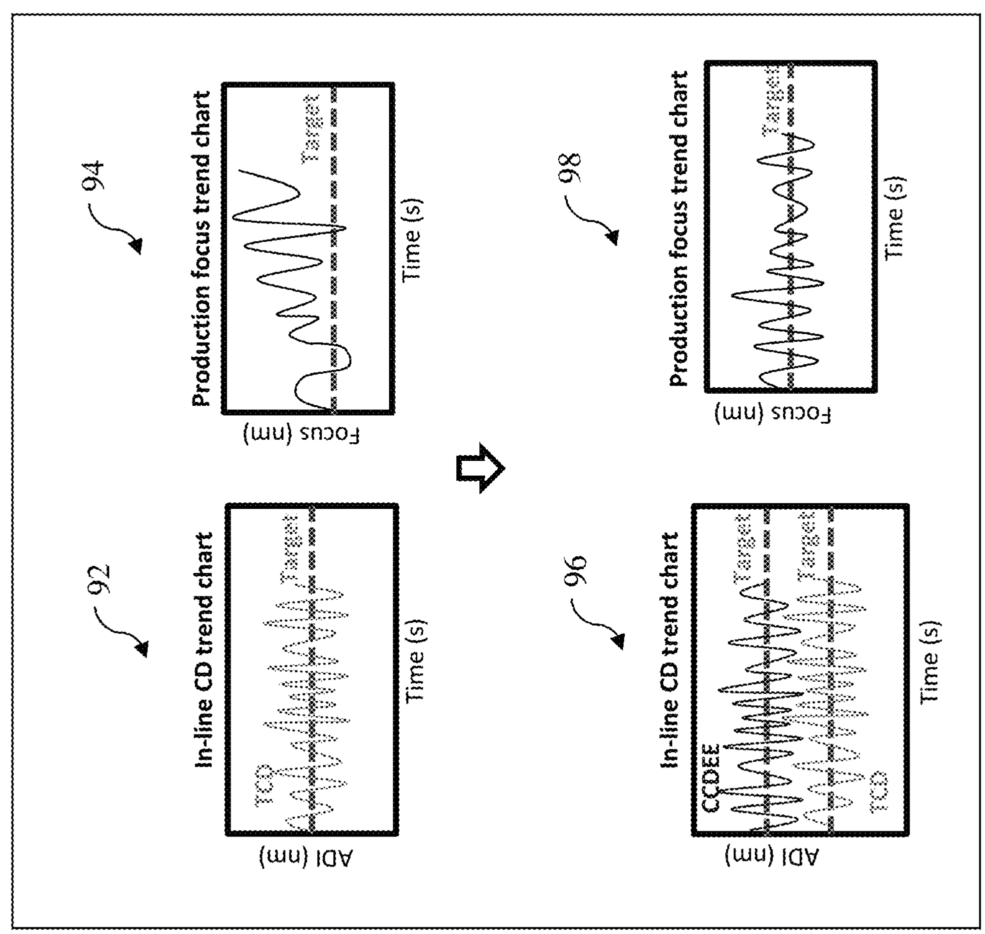
FIG. 14 illustrates statistical process control charts constructed in accordance with some embodiments.

In the existing methods, there are no effective focus monitoring and tuning through CD data. Those monitoring and tuning are not sensitive and effective to isolate the CD impact from respective focus and energy. FIG. 14 provides various statistical process control (SPC) charts for comparison in accordance with some examples. The first SPC chart 92 and the second SPC chart 94 illustrate the CD over time and focus over time, respectively, of an existing method for monitoring the lithography exposing process. It is shown that the focus moves away from the target value. The third SPC chart 96 and the fourth SPC chart 98 illustrate the CD over time and focus over time, respectively, of the disclosed method for monitoring and tuning the lithography exposing process in one example. It is shown in chart 96 that CD is monitored over both the focus-sensitive pattern ("labeled as "CCDEE") and energy-sensitive pattern (labeled as "TCD"). It is further shown in chart 98 that the corresponding focus of the lithography exposing process is effectively controlled around the target value without trend of moving away from the target value.

Figure 15:
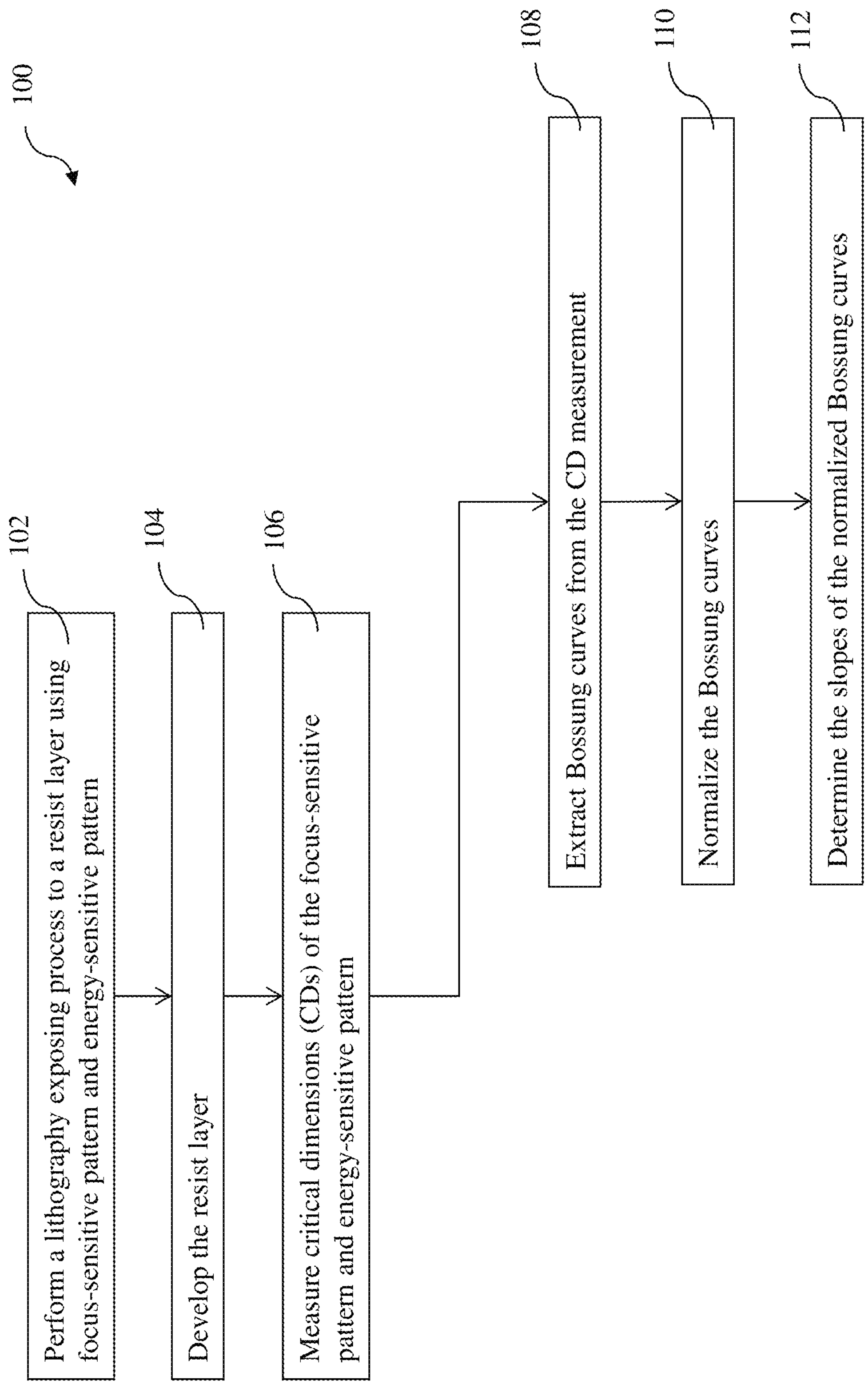
FIG. 15 is a flowchart of a method for focus and energy monitoring and controlling constructed in accordance with some embodiments.

FIG. 15 is a flowchart of a method 100 for CD monitoring of a lithography exposing process constructed in accordance with some embodiments. Some operations are similar to those described in the method 10 and the procedure 26. The method 100 begins at operation 102 by performing a lithography exposing process to a resist layer coated on a substrate (such as a semiconductor wafer) using a photomask having both energy-sensitive pattern (such as pattern 38 in FIG. 3) and focus-sensitive pattern (such as pattern 40 in FIG. 4).

The method 100 proceeds to an operation 104 by developing the exposed resist layer, thereby forming a patterned resist layer. Other processes may be additionally performed, such as a post-exposure baking may be applied to the exposed resist layer before the developing.

The method 100 includes an operation 106 to measure CDs from the energy-sensitive pattern and the focus-sensitive pattern during the after-developing inspection by suitable metrology tool, such as a microscope.

The method 100 proceeds to an operation 108 by extracting the Bossung curves from the CD data collected at the operation 106. The Bossung curves includes a plurality of energy Bossung curves with respective focus and a plurality of focus Bossung curves with respective energy. Each energy Bossung curve is a curve representing the CDs from the energy-sensitive pattern by the lithography exposing processes with a same focus but different energies. Each focus Bossung curve is a curve representing the CDs from the focus-sensitive pattern by the lithography exposing processes with a same energy but different focuses.

The method 100 proceeds to operation 110 by normalizing the Bossung curves. Thereby, the plurality of energy Bossung curves are consolidated into a single energy Bossung curve (using one focus Bossung curve) and the plurality of focus Bossung curves are consolidated into a single focus Bossung curve (using one energy Bossung curve).

The method 100 proceeds to an operation 112 to determine the energy slope of the normalizing energy Bossung curve and the focus slope of the normalized focus Bossung curve. Thus determined slopes are used to tune energy and focus of the lithography exposing process.

The present disclosure provides a method to monitor both energy and focus of a lithography exposing process using the energy-sensitive pattern and the focus-sensitive pattern. Thereby, the energy and focus factors are decoupled. The energy and focus can be effectively monitored and tuned. Especially, the energy and focus Bossung curves extracted from the respective energy-sensitive pattern and focus-sensitive pattern are substantially linear and the process tuning is easy and effective, such as according to the energy slope and the focus slope from the normalized energy and focus Bossung curves, respectively.

Although various embodiments of the methods and the lithography system are provided according to various aspects of the present disclosure, other alternatives and modifications may be used without departure of the spirit of the present disclosure. For example, the procedure 26 not only monitor and tune the energy and focus slopes but also feedback the CDs for tuning the lithography exposing process such that the CD variations are compensated. In another example, the CD measures in corresponding operation may be implemented to the production wafers, such as in daily qualification (qual) or routing qual procedure.

Thus, the present disclosure provides a method for lithography exposing process in accordance with some embodiments. The method includes performing a first lithography exposing process to a resist layer using a mask having a focus-sensitive pattern and an energy-sensitive pattern; measuring critical dimensions (CDs) of transferred focus-sensitive pattern and transferred energy-sensitive pattern on the resist layer; extracting Bossung curves from the CDs; and determining slops of the Bossung curves.

Another method for lithography exposing process is provided in accordance with some embodiments. The method includes performing a lithography exposing process to a plurality of semiconductor wafers using a mask having a focus-sensitive pattern and an energy-sensitive pattern, each of the semiconductor wafers being coated with a resist layer; developing the resist layer, thereby forming a patterned resist layer having a transferred focus-sensitive pattern and a transferred energy-sensitive pattern; measuring first critical dimension (CD) data from the transferred focus-sensitive pattern and second CD data from the transferred energy-sensitive pattern on the resist layer; extracting a first Bossung curve from the first CD data and a second Bossung curve from the second CD data; determining a first slope of the first Bossung curve and a second slope of the second Bossung curve; and performing another lithography exposing process with respective focus and energy adjusted according to the first and second slopes, respectively.

Another method for lithography exposing process is provided in accordance with some embodiments. The method includes performing a plurality of lithography exposing processes with respective energy and focus using a mask having a focus-sensitive pattern and an energy-sensitive pattern; performing a developing process to respective resist layer, thereby forming a patterned resist layer having a transferred focus-sensitive pattern and a transferred energy-sensitive pattern; measuring first critical dimension (CD) data from the transferred focus-sensitive pattern and second CD data from the transferred energy-sensitive pattern on the resist layer; extracting focus Bossung curves from the first CD data and energy Bossung curves from the second CD data; normalizing the focus Bossung curves into a normalized focus Bossung curve and the energy Bossung curves into a normalized energy Bossung curve; and determining a focus slope of the normalized focus Bossung curve and an energy slope of the normalized energy Bossung curve.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for a lithography system, comprising:

performing a first lithography exposing process to a resist layer using a mask having a focus-sensitive pattern and an energy-sensitive pattern;

developing the resist layer after the performing of the first lithography exposing process, thereby forming a transferred focus-sensitive pattern and a transferred energy-sensitive pattern on the resist layer;

measuring critical dimensions (CDs) of the transferred focus-sensitive pattern and the transferred energy-sensitive pattern on the resist layer;

extracting Bossung curves from the CDs, wherein extracting the Bossung curves includes extracting a first linear Bossung curve from the transferred focus-sensitive pattern and extracting a second linear Bossung curve from the transferred energy-sensitive pattern; and determining slopes of the Bossung curves, wherein the determining of the slopes of the Bossung curves includes determining a first slope of the first linear Bossung curve and determining a second slope of the second linear Bossung curve.

2. The method of claim 1, wherein extracting the Bossung curves further includes:

extracting a plurality of first Bossung curves at respective exposing energies; and extracting a plurality of second Bossung curves at respective focuses.

3. The method of claim 2, further comprising:

normalizing the plurality of first Bossung curves according to the respective exposing energies, thereby resulting in a first normalized Bossung curve; and normalizing the plurality of second Bossung curves according to the respective exposing focuses, thereby resulting in a second normalized Bossung curve.

4. The method of claim 3, wherein the determining of the slopes of the Bossung curves includes:

determining a first slope of the first normalized Bossung curve; and determining a second slope of the second normalized Bossung curve.

5. The method of claim 4, further comprising feeding back the first and second slopes to a second lithography exposing process.

6. The method of claim 5, wherein the feeding back of the first and second slopes includes:

tuning focus of the second lithography exposing process according to the first slope; and tuning energy of the second lithography exposing process according to the second slope.

7. The method of claim 1, further comprising coating the resist layer to a production wafer before the performing of the first lithography exposing process to the resist layer.

8. The method of claim 1, further comprising performing a second lithography exposing process with a focus and an energy tuned according to the first and second slopes, respectively.

9. The method of claim 1, further comprising normalizing the first linear Bossung curve from the transferred focus-sensitive pattern and normalizing the second linear Bossung curve from the transferred energy-sensitive pattern.

10. The method of claim 9, wherein the determining of the slopes of the Bossung curves further includes determining the first slope based on the normalized first linear Bossung curve and determining the second slope based on the normalized second linear Bossung curve.

11. A method, comprising:

performing a lithography exposing process to a plurality of semiconductor wafers using a mask having a focus-sensitive pattern and an energy-sensitive pattern, each of the semiconductor wafers being coated with a resist layer;

developing the resist layer, thereby forming a patterned resist layer having a transferred focus-sensitive pattern and a transferred energy-sensitive pattern;

measuring first critical dimension (CD) data from the transferred focus-sensitive pattern and second CD data from the transferred energy-sensitive pattern on the resist layer;

extracting a first Bossung curve from the first CD data and a second Bossung curve from the second CD data;

determining a first slope of the first Bossung curve and a second slope of the second Bossung curve; and performing another lithography exposing process with respective focus and energy adjusted according to the first and second slopes, respectively.

12. The method of claim 11, wherein the extracting Bossung curves includes:

extracting a plurality of first Bossung curves at respective exposing energies; and extracting a plurality of second Bossung curves at a respective exposing focuses.

13. The method of claim 12, further comprising:

normalizing the plurality of first Bossung curves according to the respective exposing energies, thereby resulting in a first normalized Bossung curve; and normalizing the plurality of second Bossung curves according to the respective exposing focuses, thereby resulting in a second normalized Bossung curve.

14. The method of claim 13, wherein the determining of the slopes of the Bossung curves includes:

determining a first slope of the first normalized Bossung curve; and determining a second slope of the second normalized Bossung curve.

15. The method of claim 14, further comprising feeding back the first and second slopes to a lithography exposing system that the lithography exposing process is implemented thereby.

16. The method of claim 15, wherein the feeding back of the first and second slopes includes:

tuning focus of the lithography exposing process according to the first slope; and tuning energy of the lithography exposing process according to the second slope.

17. A method, comprising:

performing a plurality of lithography exposing processes with respective energy and focus using a mask having a focus-sensitive pattern and an energy-sensitive pattern;

performing a developing process to respective resist layer, thereby forming a patterned resist layer having a transferred focus-sensitive pattern and a transferred energy-sensitive pattern;

measuring first critical dimension (CD) data from the transferred focus-sensitive pattern and second CD data from the transferred energy-sensitive pattern on the resist layer;

extracting focus Bossung curves from the first CD data and energy Bossung curves from the second CD data;

normalizing the focus Bossung curves into a normalized focus Bossung curve and the energy Bossung curves into a normalized energy Bossung curve; and determining a focus slope of the normalized focus Bossung curve and an energy slope of the normalized energy Bossung curve.

18. The method of claim of 17 further comprising performing another lithography exposing process with a focus and energy tuned according to the focus and energy slopes, respectively.

19. The method of claim 18, wherein the energy-sensitive pattern includes a plurality of line features oriented in a first direction and spanned in a second direction perpendicular to the first direction with a pitch P, wherein the line features has a width W spanned in the second direction and a ratio P/W is less than or equal to 4.

20. The method of claim 17, wherein the focus-sensitive pattern includes a plurality of line features oriented in a first direction and a width W spanning in a second direction perpendicular to the first direction, wherein a line end gap G between two adjacent features of the line features configured in a same location in the second direction with a ratio G/W less than about 1.2; and another feature of the line features configured in a different location in the second direction to the two adjacent features overlap with the line end gap in the first direction.

* * * * *